(12) United States Patent
Pongracz et al.

(10) Patent No.: US 6,269,007 B1
(45) Date of Patent: Jul. 31, 2001

(54) APPARATUS AND METHOD FOR LATCHING A CIRCUIT PACK

(75) Inventors: David John Pongracz, Bangor; Steven J. Smith, Milford, both of PA (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/414,845

(22) Filed: Oct. 8, 1999

(51) Int. Cl.[7] .................................................. H05K 7/12
(52) U.S. Cl. .................... 361/759; 361/754; 361/798; 361/801; 361/726; 439/157; 211/41.17
(58) Field of Search ................................. 361/724–727, 361/740, 753, 754, 755, 759, 796–798, 801, 807, 808; 439/152–160; 211/41.17

(56) References Cited

U.S. PATENT DOCUMENTS

| 4,232,926 | 11/1980 | Inouye et al. | 339/45 |
|---|---|---|---|
| 4,313,150 | 1/1982 | Chu. | |
| 4,632,588 | 12/1986 | Fitzpatrick | 403/16 |
| 4,648,009 | 3/1987 | Beun et al. | |
| 4,780,792 | 10/1988 | Harris et al. | |
| 4,947,289 | 8/1990 | Dynie. | |
| 4,996,631 | 2/1991 | Freehauf. | |
| 5,316,488 | 5/1994 | Gardner et al. | 439/79 |
| 5,398,164 | 3/1995 | Goodman et al. | 361/752 |
| 5,502,622 | 3/1996 | Cromwell | 361/801 |
| 5,504,656 | 4/1996 | Joist | 361/754 |
| 5,632,641 | 5/1997 | Sobel | 439/352 |
| 5,889,850 | 3/1999 | Sochacki | 379/329 |
| 5,892,662 | 4/1999 | Verma | 361/796 |

*Primary Examiner*—Jayprakash N. Gandhi
(74) *Attorney, Agent, or Firm*—Dickstein Shapiro Morin & Oshinsky LLP (57) ABSTRACT

A rotatable latch is provided for securing an object to a holder and for preventing unintended removal of the object. In a preferred embodiment, the rotatable latch has at least two actuators flexibly mounted to a body. Each actuator has a hooked portion which engages a portion of the holder. A lever portion may be provided for releasing the hooked portion. The hooked portion is rotated about a pivot point to release the object from the holder. Rotation occurs when actuators are released through use of at least two lever portions. To prevent accidental removal of the object, the second actuator cannot be released until the first actuator has been released. The latch requires at least two actions, pressing the levers in succession, to release the object. The invention is applicable, for example, to circuit packs for electronic circuit boards.

37 Claims, 9 Drawing Sheets

APPARATUS AND METHOD FOR LATCHING A CIRCUIT PACK

BACKGROUND OF THE INVENTION

1. Field of the Invention

This invention relates to an apparatus for securing a rigid plate and, in particular, to a multiple actuator latch used to secure a circuit board.

2. Description of the Related Art

System flexibility is a highly desirable trait which allows a system to respond to the changing needs and/or requirements of a user or group of users. One solution to the need for flexibility is the incorporation of interchangeable parts within such systems. This is especially true in electronics applications, where interchangability of parts increases the lifespan and functionality of a system. Interchangeable parts may be switched, upgraded, or removed without having to replace the entire system. One such interchangeable part often used in computer-based applications is the printed circuit board (PCB). Computer systems may be fabricated to use a plurality of PCBs, each containing a portion of the electronics required to allow the computer system to operate.

Figure 8:
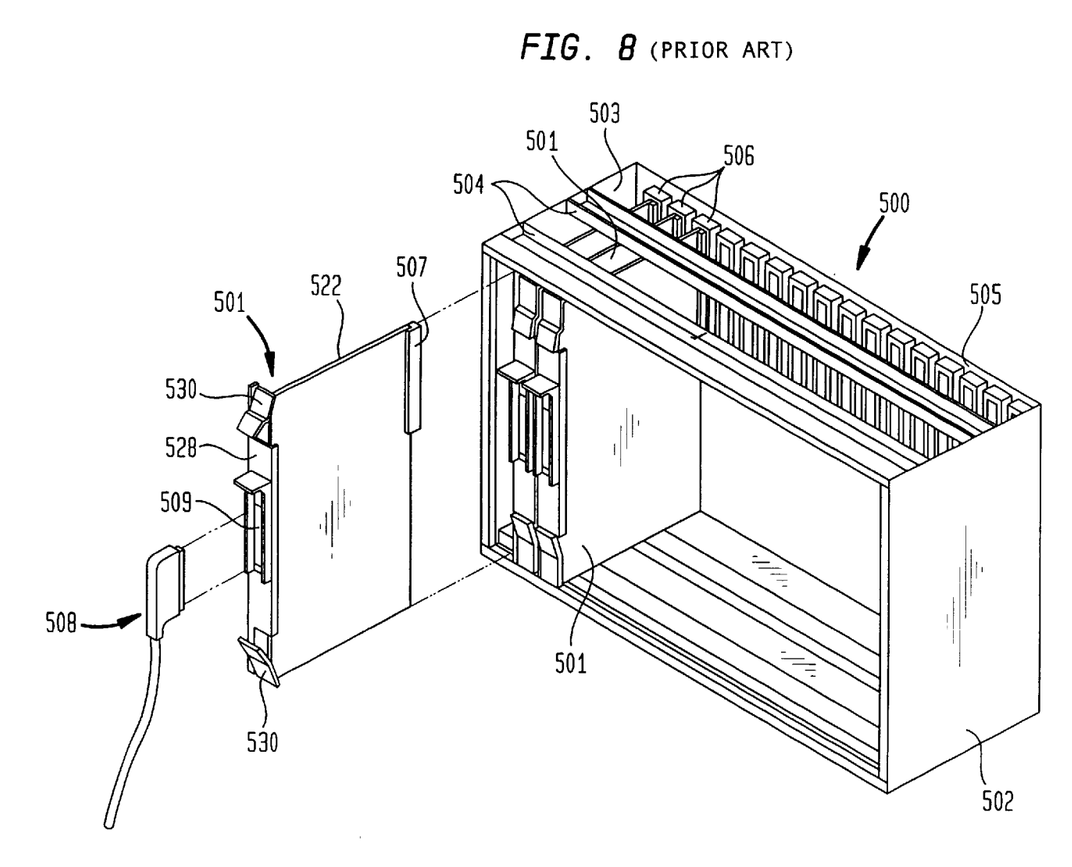
FIG. 8 is a perspective view of a known card rack and printed circuit board.

To address the need for interchangeability in complex electronics applications, e.g. computer systems, "card racks" (or "card cages") have been developed. A card rack is a relatively large enclosure containing racks or shelves capable of holding a number of PCBs in a parallel configuration. A typical card rack 500 holding a number of PCBs 501 is shown in FIG. 8. Card rack 500 consists of side plates 502 and 503 connected by supports 504. A backplane 505 is connected to side plates 502 and 503 and includes electrical connectors 506, at least one connector 506 being provided for each of the PCBs 501. Connectors 506 releasably engage connectors 507 on the PCBs 501 to allow communication between the PCB 501 and the system of which card rack 500 is a portion. Plug 508 is inserted through aperture 509 into engagement with pin connectors to complete the physical installation of the PCBs 501.

Figure 9:
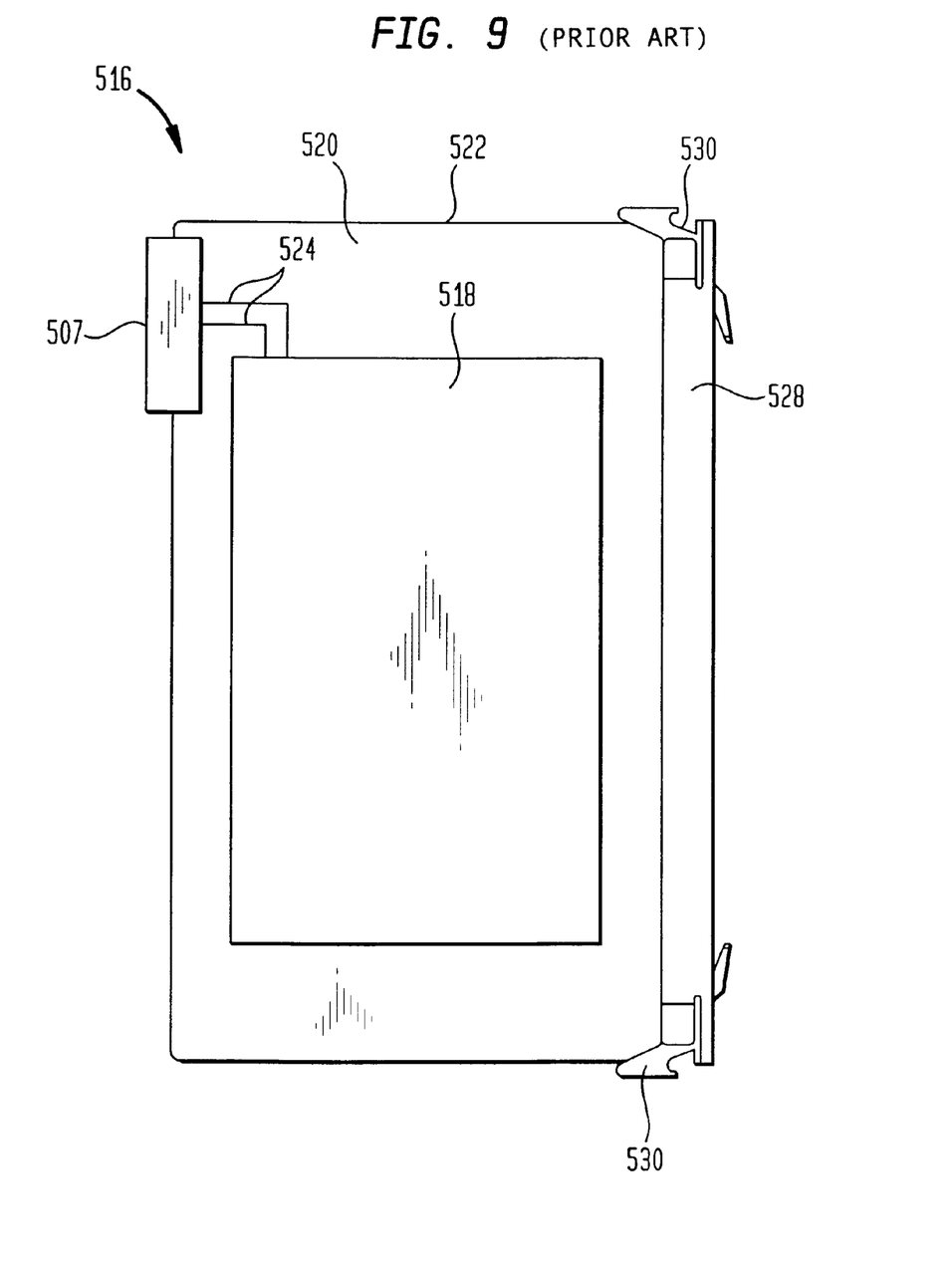
FIG. 9 is a side view of the circuit pack of FIG. 8.

Card racks and PCB's are found in numerous telecommunications applications, e.g. line units and trunk units. PCBs 501 for telecommunications applications may be in the form of circuit packs 516, as shown in FIG. 9. Each circuit pack 516 includes a plurality of signal processing components 518 mounted on a planar surface 520 of a rigid plate 522. The rigid plate 522 includes conductive paths 524 for interconnecting the components 518 to one another and to connector 507. Connector 507 is mounted on the rigid plate 522, generally on an end face of the rigid plate 522. The connector 507 contains pins and/or sockets for mating with matching connectors fixedly mounted on a rear wall of a card rack. Circuit pack 516, a specific type of PCB 501, may be removably mounted in a side-by-side, parallel relationship within a card rack 500 relative to other PCBs 501 and side plates 502, 503, as shown in FIG. 8.

The circuit pack 516 has a front face plate 528 which is mounted to the rigid plate 522. Mounting and dismounting of the circuit pack 516 occurs by sliding the edges of the rigid plate 522 along grooves within support walls of the card rack 500. Latches 530 are provided on the face plate 528 or rigid plate 522 to allow the circuit pack 516 to be secured to the card rack 500.

Figure 10:
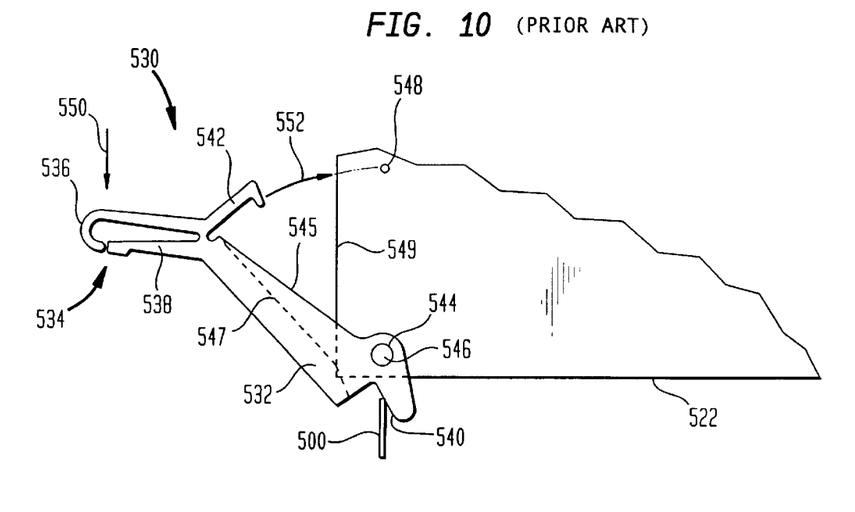
FIG. 10 is a side view of a known latch.

A known latch 530 is shown in FIG. 10. The latch 530 consists of a body portion 532; a handle portion 534 comprising both an actuating member 536 and a stop portion 538; a locking portion 540; a hooked portion 542; and a pivot point 544 which is used to pivotally mount latch 530 to rigid plate 522. The portion 545 of latch 530 nearest the rigid plate 522 is split into two sections to a depth defined by dotted line 547 which allows latch 530 to straddle the edge 549 of rigid plate 522. In operation, the latch 530 is pivoted about a pin 546 and pivot point 544 until locking portion 540 contacts an inside surface of card rack 500. The latch 530 is secured by applying downward pressure, e.g. through an operator's finger, in direction 550 to actuator 536 which allows hooked portion 542 to be raised above pin 548. While retaining downward pressure in direction 550, additional pressure is placed on the actuator 536 in direction 552 until hooked portion 542 passes over pin 548. The pressure on actuator 536 is then released, e.g. by the operator removing the finger, allowing hooked portion 542 to be lowered and engage pin 548. To release the latch 530, downward pressure is again applied to actuator 536 which raises hooked portion 542 and allows the latch 530 to become disengaged from pin 548 and rotate freely in the reverse of direction 552.

Latches 530 of the type shown in FIG. 10 are susceptible to inadvertent or accidental removal of the rigid plate 522. A single motion on the actuator 536 may cause the latch 530 to become disengaged and allow the circuit pack 516 to be removed. In addition, if an actuator 530 becomes weakened or loose (e.g. from use, environmental conditions, etc.) the latch 530 may become disengaged. Such a result is not only undesirable, but may result in large-scale system failure if an essential circuit pack 516 is inadvertently removed.

Thus, there exists a need for a securing mechanism for a circuit board which prevents accidental or inadvertent removal of the board once it is inserted and connected into a card rack.

SUMMARY OF THE INVENTION

The present invention provides a latch that is able to secure a printed circuit board or circuit pack to a card rack while preventing its accidental or undesired removal. In a preferred embodiment, the latch includes at least two actuators flexibly mounted to a body. Each actuator has a hooked portion for securing the actuator from movement and a lever portion to release the hooked portion. The body is pivotably mounted to a circuit board or circuit pack. When fully latched, the object is secured to a card rack by the hooked portion. The hooked portion is capable of being moved when the body is rotated about the pivot point. Rotation occurs when the actuators are released through use of the lever portions. To prevent unintended removal of a circuit board or circuit pack secured by the latch, the second actuator may not be released until the first actuator has been released. The latch thus requires at least two actions, pressing the lever portions in succession, to release the circuit board or circuit pack from a card rack.

BRIEF DESCRIPTION OF THE DRAWINGS

The foregoing and other advantages and features of the invention will become more apparent from the detailed description of preferred embodiments of the invention given below with reference to the accompanying drawings in which.

DETAILED DESCRIPTION OF PREFERRED EMBODIMENTS

Figure 1:
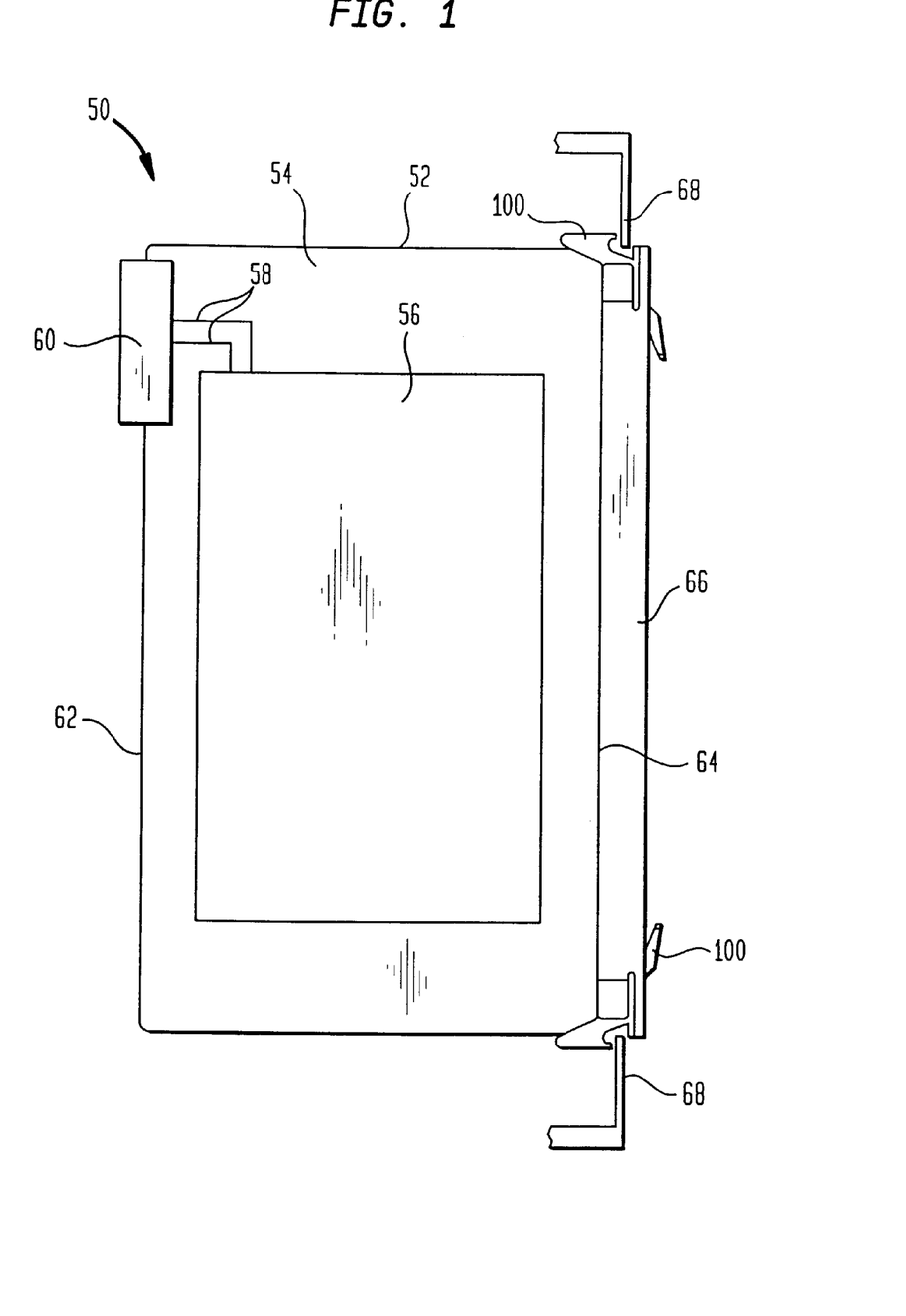
FIG. 1 is a side view of a circuit pack employing a latch of the present invention.

Referring now to the drawings, where like reference numerals designate like elements, there is shown in FIG. 1 a circuit card or pack 50 having latches constructed according to the invention. Circuit pack 50 may have electronic circuitry 56 mounted thereon. The pack 50 may be plugged into a connector on a card rack 68. The circuit pack 50 includes a thin rigid plate 52 which has a flat surface 54 with electronic circuitry 56 mounted thereon. Conductor lines 58 connect the circuitry 56 to an electrical connector 60 disposed on at least one of the end surfaces 62, 64 of the rigid plate 52. Mounted on the end surface 64 of the circuit pack 50 is a faceplate 66. Near the top and bottom corners of the faceplate 66 and rigid plate 52 are latching levers 100 which are used to aid in the insertion and removal of the circuit pack 50. In addition, latches 100 engage card rack 68 to secure the circuit pack 50 from movement.

Figure 2:
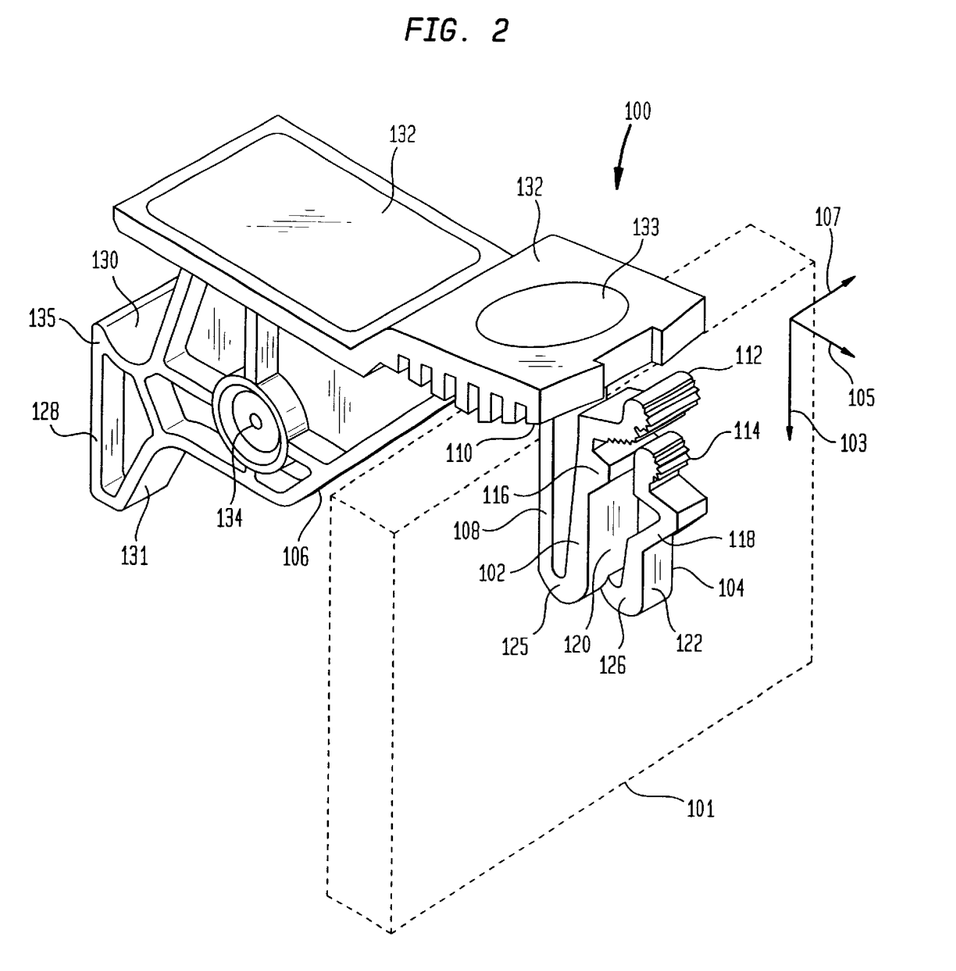
FIG. 2 is a perspective view of a latch of the present invention.
Figure 3:
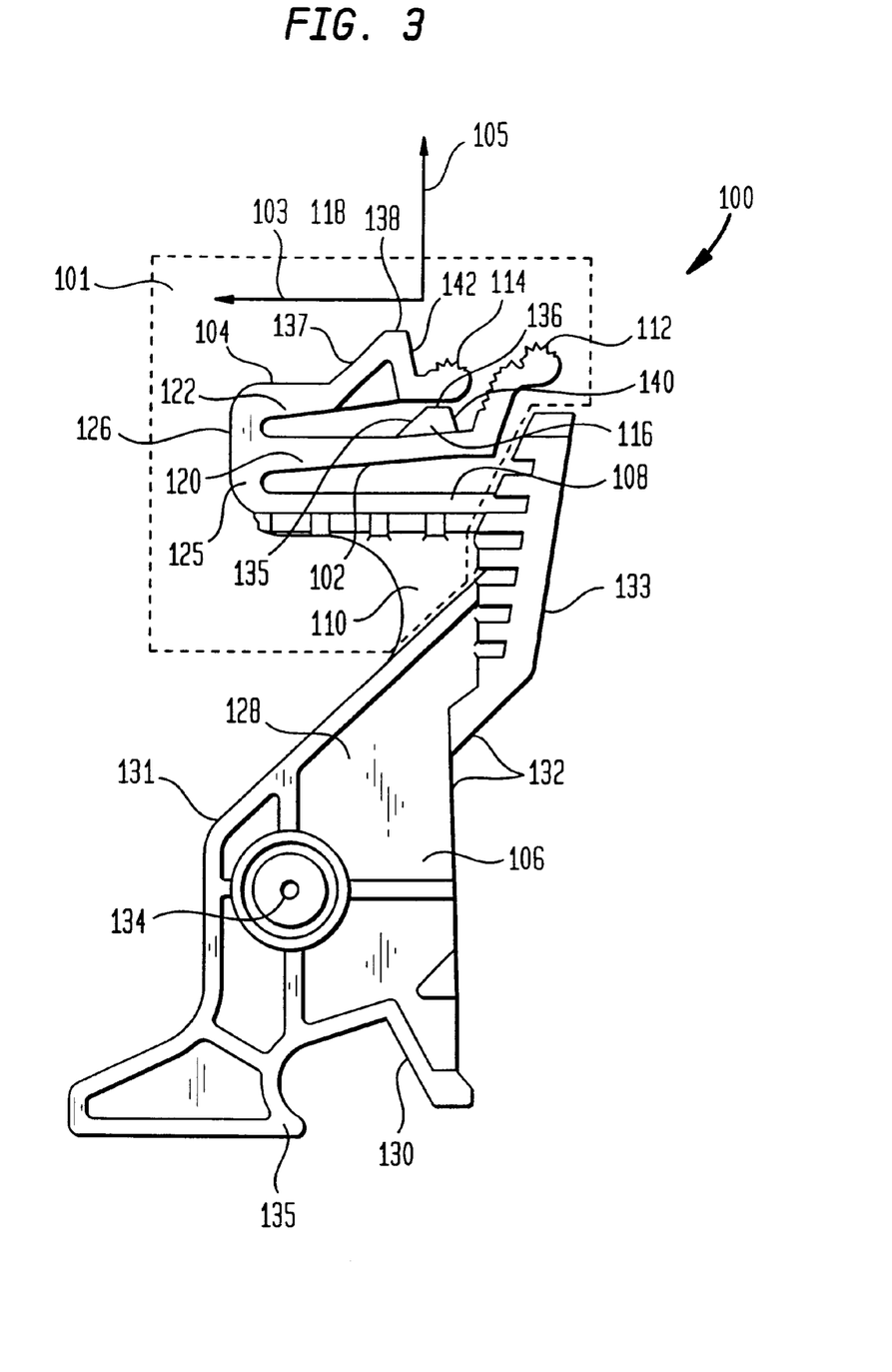
FIG. 3 is a side view of the latch of FIG. 2.

Referring now to FIGS. 2 and 3, each latch 100 has a body portion 106 and an actuator assembly 101. Latch 100 is preferably formed of molded polypropylene or nylon, but may be constructed of other suitable materials or combinations of materials. The body portion 106 includes a solid body having side surfaces 128, a bottom surface 131, a top surface 132, a concave finger rest 133, and a hooked portion 130. Hooked portion 130 is a portion of the body portion 106 which forms an indentation between top surface 132 and bottom surface 131. When the latch 100 is in a latched position, the hooked portion 130 engages card rack 68 to prevent removal of the circuit pack 50. The body portion 106 also includes a cylindrical aperture 134 for receiving a cylindrical pin or rod (not shown). The latch 100 may be rotatably mounted on the pin or rod. The pin or rod may be integrally connected to the main portion of the circuit pack 50.

The actuator assembly 101 extends from the body portion 106 in a direction 103 which is generally perpendicular to top surface 132 and parallel to side surfaces 128. The actuator assembly 101 may have at least two actuators 102, 104 connected to a support portion 108. The support portion 108 is connected to the body portion 106. The support portion 108 may be generally perpendicular to top surface 132. In addition, to further prevent movement, the support portion 108 and body portion 106 are, preferably, further attached to one another through a brace portion 110. Actuators 102, 104 each include respective activation portions 112, 114, retainers 116, 118, connector portions 120, 122, and flex portions 124, 126. Flex portion 124 extends approximately perpendicularly from support portion 108 in direction 105.

Connector portions 120, 122 extend from respective flex portions 124, 126 in a direction opposite direction 102. The direction 102 is generally perpendicular to the flex portions 124, 126 and toward body portion 106. Activation portions 112, 114 extend generally in direction 105 from the ends of respective connector portions 120, 122 which are opposite the flex portions 124, 126. Activation portion 112 is preferably longer than activation portion 114 in direction 105. The ends of the activation portions 112, 114 opposite connector portions 120, 122 are located in a common plane parallel to direction 103. The illustrated arrangement allows a user unobscured access to either activation portion 112, 114.

The retainers 116, 118 extend in direction 105 from respective connector portions 120, 122 and are thus generally parallel to flex portions 124, 126. The retainers 116, 118 are located between the flex portions 124, 126 and activation portions 112, 114. Connector portion 120 preferably has a width greater than that of connector portion 122. Retainer 116 preferably has a width less than that of connector portion 120. Retainer 118 preferably has a width approximately equal to connector portion 122. The combined width of the retainers 116, 118 equals the width of the connector portion 120. Connector portion 122 is displaced in direction 107 such that retainer 116 is not obscured by connector portion 122 when viewed in the direction 105.

Each retainer 116, 118 includes respective sloping surfaces 135, 137, horizontal upper surfaces 136, 138 and locking surfaces 140, 142. Upper surfaces 136, 138 are substantially parallel to connector portions 120, 122. The sloping surfaces 135, 137 are opposite locking surfaces 140, 142 and face the activation portions 112, 114. Retainer 118 is preferably laterally displaced from retainer 116 in direction 103. Locking surface 142, while having a similar width, is also preferably longer in direction 105 than locking surface 140. This prevents inadvertent release of locking surface 142 when activation portion 112 is pushed toward support 108.

Figure 4:
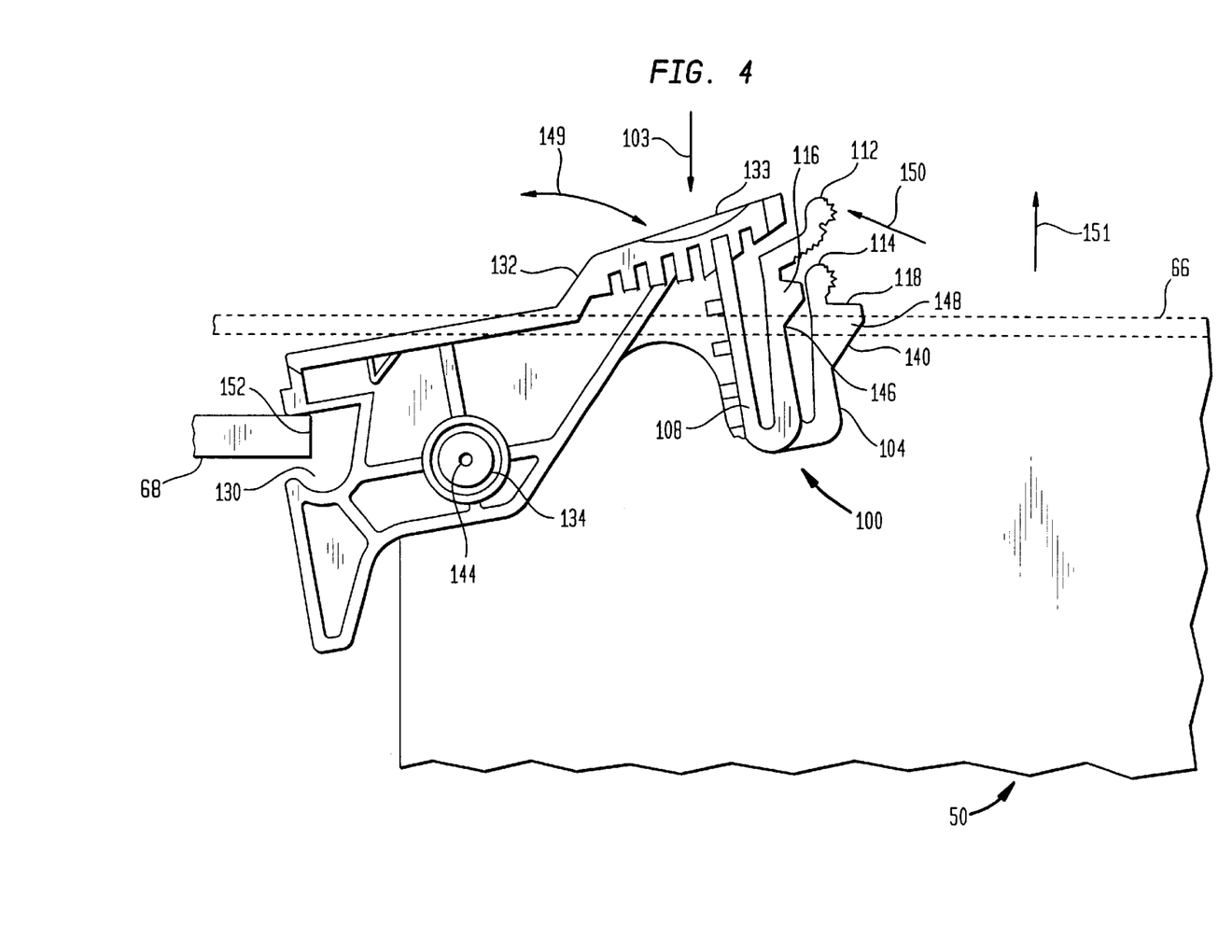
FIGS. 4–6 are diagrams of the latch of FIG. 2 in use.
Figure 5:
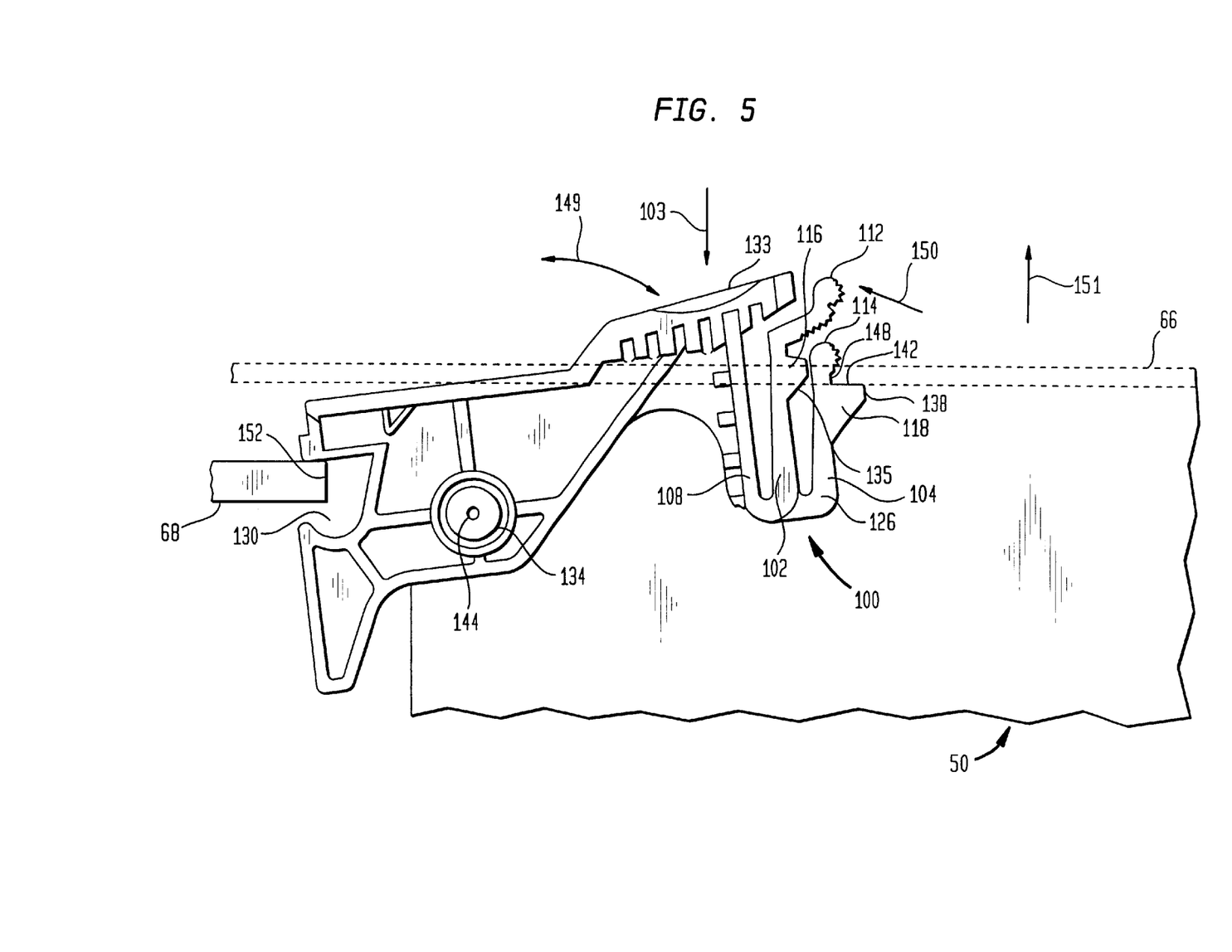
Figure 6:
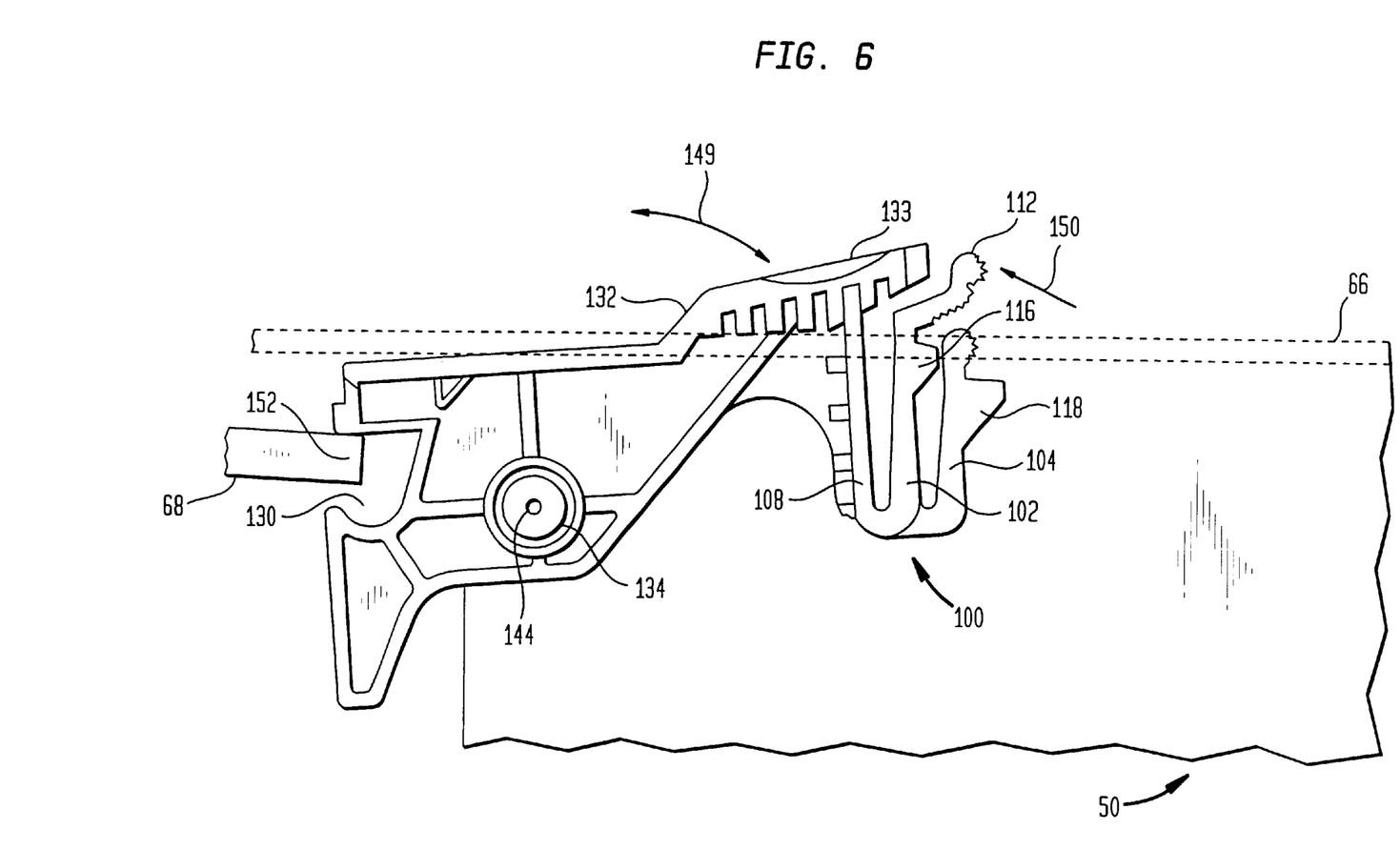

FIGS. 4 to 6 illustrate the latch 100 in operation. Card rack 68 is capable of holding at least one circuit pack 50 in a secured fashion by the engagement of latch hooked portion 130 with a portion of card rack 68. FIG. 4 shows a circuit pack 50 prior to its being locked in place within a card rack 68. Latch 100 is secured to circuit pack 50 prior to insertion into card rack 68 through cylindrical aperture 134 which engages pin 144. While shown with one latch 100, it may be preferable to have two latches 100 mounted on a selected or critical circuit pack 50 to further ensure that unintended removal of the circuit pack 50 will not occur. Latch 100 is free to rotate about cylindrical aperture 134 along path 149.

To insert the circuit pack 50 into the card rack 68, a force is applied against finger rest 133 (or on the faceplate 66) in direction 103. The circuit pack 50 is pushed in as far as possible to engage connectors 60 with connectors in card rack 68 as shown in FIG. 1. Returning to FIG. 4, as the circuit pack 50 is inserted into the card rack 68, the hooked portion 130 engages the end portion 152 causing the latch 100 to rotate clockwise about the pin 144 toward a closed position.

Figure 7:
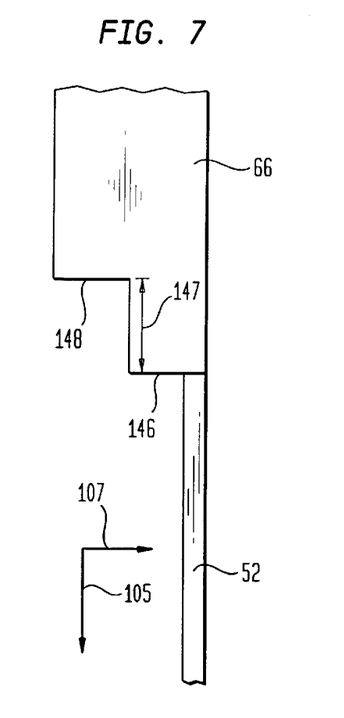
FIG. 7 is a partially broken away end view of the faceplate of the circuit pack of FIG. 1.

In the locked position, end portion 152 of card rack 68 is within the space defined by hooked portion 130, effectively securing the circuit pack 50 from being withdrawn in direction 151. This is effective, however, only so long as the latch 100 is restricted from pivoting about cylindrical aperture 134. To prevent the latch 100 from rotating, the latch 100 is secured to the faceplate 66. Retainers 116, 118 are secured within faceplate 66 by contact with edges 146, 148, respectively. The faceplate 66 may be constructed such that edges 146, 148 are perpendicular to direction 105, as shown in FIG. 7. Edges 146, 148 are sized to accommodate retainers 116, 118 and are separated by a distance 147 which is approximately equal to the distance between locking surfaces 140, 142 along direction 103, as shown in FIGS. 4 and 7.

As pressure is applied to finger rest 133 in direction 103, the base of sloping surface 137 engages edge 148 on faceplate 66, as shown in FIG. 4. The resultant camming action causes the actuator 104 to flex toward support piece 108 until edge 148 passes over upper surface 138 and engages locking surface 142 as shown in FIG. 5. Actuator 104 reflexively returns to its initial position through the resilience of flex portion 126. Thus, latch 100 is prevented from further rotation about cylindrical aperture 134. The engagement of locking surface 142 with cutout portion 148 prevents clockwise motion along path 149. The engagement of hooked portion 130 with card rack 68 prevents counterclockwise motion along path 149.

While engagement of locking surface 142 prevents the latch 100 from rotation about cylindrical aperture 134, further engagement of actuator 102 with edge 146 will effectively prevent inadvertent or accidental removal of circuit pack 50. Actuator 102 is engaged in a similar manner to that described above with reference to actuator 104. Pressure continues to be applied to finger rest 133 in direction 103 which causes the base of sloped surface 135 to engage edge 146. Further pressure forces the actuator 102 to flex toward support piece 108 until edge 146 passes over upper surface 136 and engages locking surface 140. Actuator 102 then reflexively returns to its initial position through the resilience of flex portion 124. Now both actuators 102, 104 independently secure the latch 100 to faceplate 66, as shown in FIG. 6.

To disengage latch 100 and allow release of the circuit pack 50 from card rack 68, both actuators 102, 104 must be released. A user places pressure on activation portion 112 in direction 150 such that actuator 102 flexes toward support member 108. Pressure on activation portion 112 in direction 150 allows latch 100 to rotate counterclockwise along path 149. This action causes edge 146 to pass over upper portion 136 and release retainer 116 from engagement with face plate 66. However, latch 100 will still be prevented from releasing the circuit pack 50 due to the engagement of locking surface 142 with edge 148.

To fully release the latch 100, the user next places pressure on activation portion 114 in direction 150, as shown in FIG. 5, such that actuator 104 flexes toward support member 108 until edge 148 is released from engagement with locking portion 142. The user then continues to rotate the latch 100 counterclockwise along path 149 such that cutout portion 148 passes over upper portion 138. This releases retainer 118 and allows latch 100 to fully pivot about pin 144 until end portion 152 is no longer secured by hooked portion 130. By requiring two separate actuators 102, 104 to be individually and sequentially actuated to release circuit pack 50, a secure, cost efficient, and effective mechanism for reliably holding the circuit pack 50 in the card rack 68 is achieved. In addition, by having two actuators 102, 104 which are integral to the latch 100, no additional or extra part is necessary to provide the security of the double actuator latch of the invention.

Although the invention has been described with reference to circuit packs, it is to be understood that the invention also may be used on trunk cards, interface cards, or other devices.

The above description and drawings illustrate preferred embodiments which achieve the objects, features and advantages of the present invention. It is not intended that the present invention be limited to the illustrated embodiments, however. Any modification of the present invention which comes within the spirit and scope of the following claims should be considered part of the present invention.

What is claimed as new and desired to be protected by Letters Patent of the United States is:

1. A latch for securing a planar object within a holder, said latch comprising:
   a body portion having a pivot point coupled to said object;
   a latching portion depending from a first end of said body portion for engaging with a portion of said holder to hold said object within said holder; and
   at least first and second actuators depending from a second end of said body portion opposite said first end for securing said body portion from movement about said pivot point, said first and second actuators being engagable with a portion of said planar object, said first and second actuators being arranged such that said first actuator must be released prior to said second actuator being released in order to release said object from said holder.

2. The latch of claim 1, wherein said first and second actuators have first and second retainers for engaging said portion of said planar object, said first retainer being laterally displaced from said second retainer such that said first actuator may be actuated to release said first retainer from said portion of said planar object without releasing said second retainer from portion of said planar object.

3. The latch of claim 2, wherein said body portion is pivotally mounted to a circuit pack.

4. The latch of claim 3, wherein said circuit pack has a face plate for engaging said first and second actuators.

5. The latch of claim 4, wherein said face plate has at least first and second cutout portions having edges for retaining said first and second retainers.

6. The latch of claim 5, wherein said first and second retainers have first and second locking surfaces for engaging said edges of said first and second cutout portions.

7. The latch of claim 6, wherein said second locking surface is longer than said first locking surface such that actuation of said first actuator releases said first retainer from said first cutout portion but does not release said second retainer from said second cutout portion.

8. The latch of claim 2, wherein said first and second actuators further comprise first and second actuation members for receiving forces which cause said first and second actuators to move said first and second retainers.

9. The latch of claim 8, wherein said first and second actuation members are grooved.

10. The latch of claim 1, wherein said latch is constructed of polypropylene.

11. The latch of claim 1, wherein said latch is constructed of nylon.

12. The latch of claim 2, wherein said body portion, said latching portion, and said first and second actuators are part of an integral structure.

13. A latch for securing a circuit card within a card rack, said latch comprising:
   a body portion having a pivot point coupled to said circuit card;
   at least first and second actuators depending from said body portion for securing said body portion from movement about said pivot point, wherein said first actuator is connected to said body portion by a resilient connection and said second actuator is connected to said first actuator by a resilient connection;
   a latching portion depending from a first end of said body portion opposite said first and second actuators; and
   wherein said first and second actuators have respective first and second retainers, said first and second retainers having respective first and second locking surfaces for engaging said circuit card, wherein said second locking surface is longer than said first locking surface such that actuation of said first actuator does not release said second retainer from said circuit card.

14. The latch of claim 13, wherein said first retainer is laterally displaced from said second retainer such that said first actuator may be actuated to release said first retainer from said circuit card without releasing said second retainer from said circuit card.

15. The latch of claim 13, wherein said body portion is pivotally mounted to said circuit card.

16. The latch of claim 13, wherein said circuit card has a face plate for engaging said first and second actuators.

17. The latch of claim 16, wherein said face plate has first and second cutout portions having edges for engaging said first and second retainers.

18. The latch of claim 17, wherein said first and second retainers have first and second locking surfaces for engaging said edges of said first and second cutout portions.

19. The latch of claim 13, wherein said first and second actuators further comprise first and second actuation members for receiving forces which cause said first and second actuators to move said first and second retainers.

20. The latch of claim 19, wherein said first and second actuation members are grooved.

21. A latch for securing a circuit card within a card rack, said latch comprising:
  a body portion having a pivot point coupled to said circuit card;
  at least first and second actuators depending from said body portion for securing said body portion from movement about said pivot point, wherein said first actuator is connected to said body portion by a first resilient connection and said second actuator is connected to said first actuator by a second resilient connection;
  a latching portion depending from an end of said body portion; and
  wherein said first and second actuators have respective first and second retainers, wherein said first retainer is laterally displaced from said second retainer toward said body portion such that said first actuator may be actuated without releasing said second retainer.

22. The latch of claim 21, wherein said body portion is pivotally mounted to said circuit card.

23. The latch of claim 21, wherein said circuit card has a face plate for engaging said first and second actuators.

24. The latch of claim 23, wherein said face plate has at least first and second cutout portions having edges for engaging said first and second retainers.

25. The latch of claim 24, wherein said first and second retainers have first and second locking surfaces for engaging said first and second cutout portions.

26. The latch of claim 25, wherein said second locking surface is longer than said first locking surface such that actuation of said first actuator does not release said second retainer from said second cutout portion.

27. A latch for securing a circuit card within a card rack, said latch comprising:
  a body portion having a top surface, a pair of side surfaces, a bottom surface, and a pivot point through said side surfaces, said pivot point being rotatably connected to said circuit card;
  an actuator mechanism depending from said bottom surface of said body portion for securing said body portion from movement about said pivot point, said actuator mechanism comprising: a support portion depending from said bottom surface of said body portion in a direction generally perpendicular to said top surface; a first actuator having a first resilient connection connected to said support portion, a first arm extending from said first resilient connection toward said bottom surface and generally parallel to said support portion, a first retainer portion depending in a generally perpendicular direction from said first arm, and a first activation portion depending from an end of said first arm opposite said first resilient connection for receiving actuation pressure; and a second actuator having a second resilient connection connected to said first resilient connection, a second arm extending from said first resilient connection toward said bottom surface and generally parallel to said first arm, a second retainer portion depending in a generally perpendicular direction from said second arm, and a second activation portion depending from an end of said second arm opposite said second resilient connection for receiving actuation pressure; and
  a latching portion depending from an end of said body portion opposite said actuator mechanism.

28. The latch of claim 27, wherein said first retainer portion comprises at least a first locking surface and said second retainer portion comprises at least a second locking surface, said first and said second locking surfaces engaging said circuit card when said first and second actuators are in a first state, said first and said second locking surfaces being disengaged from said rigid plate when said first and second actuators are in a second state.

29. The latch of claim 27, where said first retainer portion is laterally displaced from said second retainer portion on said first arm.

30. The latch of claim 27, wherein said circuit card contains telecommunication circuitry.

31. The latch of claim 27, wherein said circuit card has at least first and second cutout portions having edges capable of receiving said first and second retainer portions.

32. A method of securing a circuit board device within a holder, said method comprising the steps of:
  rotating a latch in a first direction, such that a first actuator is engaged; and
  subsequently, rotating said latch such that a second actuator is engaged.

33. The method of claim 32, wherein said circuit board device includes a circuit card.

34. The method of claim 33, wherein said holder is a card rack.

35. A method of removing a circuit board device from a holder, said method comprising the steps of:
  flexing a first actuator on a rotatable latch until said first actuator is released, said rotatable latch being mounted on a rigid plate and hooking said rigid plate to a holder, rotating said rotatable latch in a first direction to unhook said rigid plate from said holder a predetermined amount;
  flexing said second actuator until said second actuator is released from the rigid plate; and
  further rotating said latch by said predetermined amount to permit said rigid plate to be released from said holder.

36. The method of claim 35, wherein said rigid plate is a circuit card.

37. The method of claim 36, wherein said holder is a card rack.

* * * * *